United States Patent [19]
Lee

[11] Patent Number: 5,663,082
[45] Date of Patent: Sep. 2, 1997

[54] ELECTROSTACTIC DISCHARGE PROTECTION STRUCTURE FOR LIGHTLY DOPED CMOS INTEGRATED CIRCUIT PROCESS

[75] Inventor: Jian-Hsing Lee, Hsin-Chu, Taiwan

[73] Assignee: Taiwan Semiconductor Manufacturing Company, Ltd., Hsin-Chu, Taiwan

[21] Appl. No.: 654,516

[22] Filed: May 28, 1996

[51] Int. Cl.[6] ............................................... H01L 21/8238
[52] U.S. Cl. ........................... 438/234; 438/202; 438/305; 438/307
[58] Field of Search ..................... 437/34, 44, 51, 437/56, 57, 58

[56] References Cited

U.S. PATENT DOCUMENTS 5,142,345  8/1992  Miyata ........................... 257/360
5,246,872  9/1993  Mortensen ........................ 437/44
5,516,717  5/1996  Hsu ............................... 437/51

*Primary Examiner*—Chandra Chaudhari
*Attorney, Agent, or Firm*—George O. Saile

[57] ABSTRACT

An electrostatic discharge protection device structure having a lightly doped drain area at the source to allow a faster time to start conduction in an electrostatic discharge event and an abrupt junction at the drain to allow for a low voltage during the conduction of an electrostatic discharge event. The electrostatic discharge protection device structure will be fabricated using standard lightly doped drain CMOS processing.

4 Claims, 9 Drawing Sheets

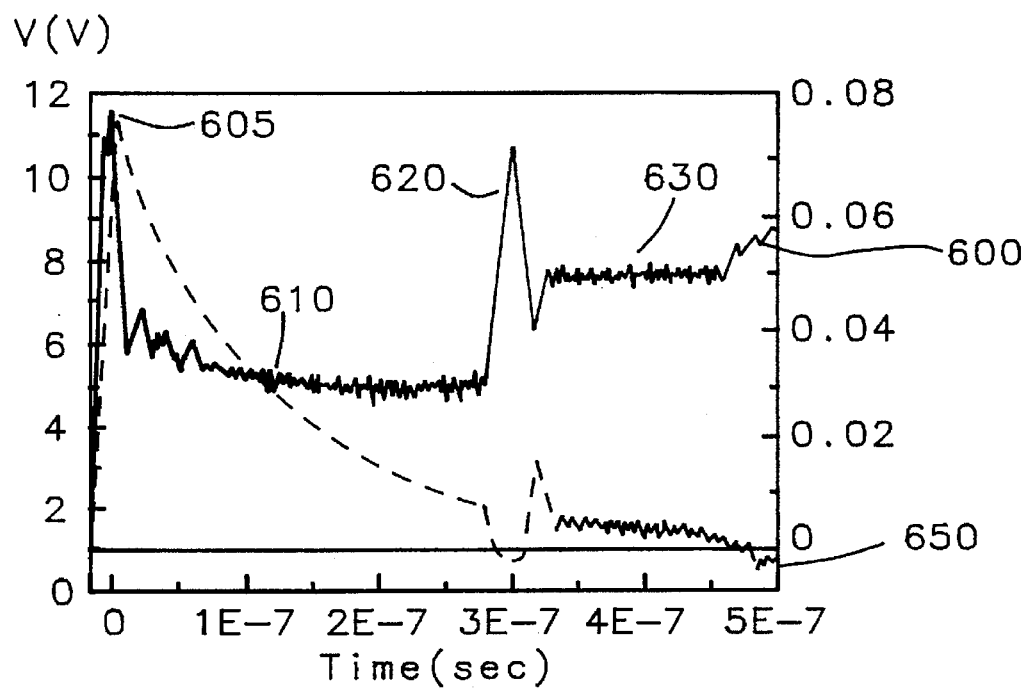
FIG. 3c - Prior Art
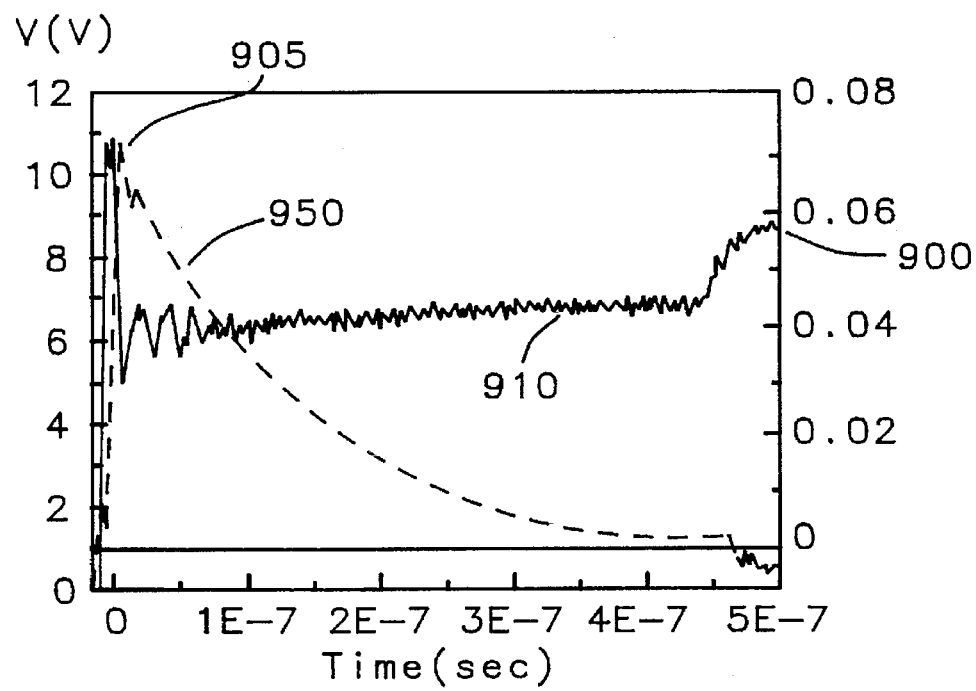
FIG. 3d - Prior Art

ELECTROSTACTIC DISCHARGE PROTECTION STRUCTURE FOR LIGHTLY DOPED CMOS INTEGRATED CIRCUIT PROCESS

BACKGROUND OF THE INVENTION

1. Field of the Invention

The present invention relates to Complementary Metal Oxide Semiconductor (CMOS) integrated circuits and more particularly to the semiconductor device structures that are placed at the input of the integrated circuits to protect said integrated circuits from damage as a result of excess voltage due to an electrostatic discharge (ESD) event.

2. Description of Related Art

Referring to FIG. 1, an internal integrated circuit is connected to a PAD on a semiconductor substrate to pass signals into and out of said internal Integrated circuit. N-type Metal Oxide Semiconductor (NMOS) transistor N1 and P-type Metal Oxide Semiconductor (PMOS) transistor P1 are connected between the PAD and the voltage reference source Vss and the voltage power supply Vcc, respectively. The NMOS transistor N1 and the PMOS transistor P1 are each configured as reversed biased MOS diodes.

A model ESD source such as the ESD generator consists of resistor R1, capacitor C1, and switch S1. When switch S1 is such that the resistor R1 and capacitor C1 are connected to the ESD voltage source V1, the capacitor C1 is charged to the ESD voltage V1. The magnitude of the ESD Voltage V1 is on the order of many hundreds of volts, even thousands of volts.

As the switch S1 changes the connection from the ESD voltage source V1 to the resistor R1, the ESD voltage V1, that is present on the capacitor C1, is transferred to the PAD through the resistor R1. When the voltage present on the PAD exceeds the breakdown voltage of the drain to substrate junction of the NMOS transistor N1 and the VSS is connected to the ground reference voltage and the point normally connected to the voltage power supply Vcc is disconnected and is floating, the NMOS transistor N1 begins to conduct and the voltage of the resistor R2 is clamped at the level of the breakdown voltage of the NMOS transistor N1 preventing damage to the internal integrated circuit. If the polarity of the ESD voltage source V1 is reversed and the node VSS that is normally connected to the ground reference voltage and the node that is normally connected to the voltage power supply Vcc is now connected to the ground reference voltage, the PMOS transistor P1 is in breakdown to clamp the voltage level at the resistor R2 to a level of the breakdown voltage of the PMOS transistor P1 less the value of the Vcc, to prevent damage again to the internal integrated circuits.

FIG. 2a illustrated the cross sectional view of a standard lightly doped drain (LDD) NMOS transistor and FIG. 2b illustrates the cross sectional view of a LDD PMOS transistor. The LDD NMOS and PMOS transistors form the standard devices that comprise the internal integrated circuits of FIG. 1. In FIG. 2a, N$^+$ diffusions 10 and 40 respectively form the drain and source on a P-type substrate 60. The P-type substrate 60 has a P$^+$ diffusion 50 formed in it to provide a high conductivity path for the connection with the ground reference terminal 55. The N$^-$ regions 20 and 30 form the lightly doped drains, which when the NMOS transistor is conducting help decrease the length of the gate channel 70 to improve performance of the NMOS transistor.

An insulating film 80 is deposited above the gate channel 70 to form the gate oxide and the metal region 90 forms the gate of the NMOS transistor.

To create the input protection device N1 of FIG. 1, the gate 90 and the source 40 are connected to the ground reference terminal 55, while the drain is connected to the PAD 5.

In FIG. 2b, P$^+$ diffusions 110 and 140 respectively form the drain and source in an N-well 165 on a P-type substrate 160. The N-well 165 has a N$^+$ diffusion 150 formed in it to provide a high conductivity path for the connection with the voltage supply terminal (Vcc) 155. The P$^-$ regions 120 and 130 form the lightly doped drains, which when the PMOS transistor is conducting help decrease the length of the gate channel 170 to improve performance of the PMOS transistor.

An insulating film 180 is deposited above the gate channel 170 to form the gate oxide and the metal region 190 forms the gate of the NMOS transistor.

To create the input protection device P1 of FIG. 1, the gate 190 and the source 140 are connected to the ground reference terminal 155, while the drain is connected to the PAD 105.

FIG. 3a illustrates the mechanism of an ESD event on an NMOS transistor as shown in FIG. 2a. The drain 410 and the source 440 are diffusions of N$^+$ material into P-type substrate 460. The LDD regions are formed by the N$^-$ diffusions 420 and 430. The insulating film 480 forms the gate oxide, while the metal layer 490 forms the gate for the NMOS transistor. The P-type substrate 460 has a P$^+$ diffusion 450 to provide a region of high conductivity that will connect the P-type substrate 460 to the ground reference terminal 455. The gate 490 and the source 440 are connected to the ground reference terminal 455 and the drain 410 is connected to the PAD 405, to form the connections for the NMOS transistor N1 of FIG. 1.

The NMOS transistor has parallel parasitic bipolar transistors 425 and 426 that are formed by the semiconductor structure of the NMOS transistor. The emitters of the parasitic transistor 425 and 426 are the source diffusions 430 and 440. The collectors are the drain diffusion 410 and 420, while the bases are formed by the area of the P-type substrate 460 between the source 430 and the drain 410 of the NMOS transistor. The base resistor 465 is the resistance of the P-type substrate 460 to the P$^+$ diffusion 450.

The ESD generator 401 operates by switch S1 connecting the capacitor C1 with the voltage source V1. As with the ESD generator of FIG. 1, the amplitude of the voltage source V1 may be many hundreds of volts and in fact may be on the order of 1000 V–2000 V. The capacitor is charged to this voltage. The switch is changed to contact the resistor 405. The voltage is transferred throught the resistor 405 to the drain diffusions 4410 and 420. A large voltage field 415 builds in the gate oxide 480 between the gate 490 and the drain diffusions 410 and 420. This large field stimulates a Fowler-Norheim Tunneling current and the band to band current 412 from the gate 490 to the drain diffusions 410 and 420. Also, the large voltage at the drain diffusions 410 and 420 cause a voltage field Eh 417 between the drain diffusions 410 and 420 and the P-type substrate 460. This flow of electrons to the depletion region 411 at the drain diffusions 410 and 420 causes a flow of hole current 416 and 418 to the P-type substrate 460. The current 418 develops a voltage across the base resistor 465 which is sufficient to place the parasitic transistor 425 into conduction, thus driving the NMOS transistor as shown in FIG. 2a into the snap-back to the clamp the voltage to a level that will prevent damage to gate oxide 480 and the internal integrated circuit of FIG. 1.

FIG. 3b is an energy band diagram of the process of FIG. 3a. The electrons 530 from the gate are forced across the gate oxide 550 by the field from the drain diffusions 410 and 420 of FIG. 3a. At the same time the electrons 520 are forced into the depletion region 560 by the electric field Eh 417 of FIG. 3a. This causes the counter hole flow 510 that is the hole current 418 of FIG. 3a.

FIG. 3c is a graph of the voltage 600 developed from the drain diffusions 410 and 420 and the ground 455 of FIG. 3a and the current 650 is the current flow through the parasitic resistor 425 of FIG. 3a. At the beginning of an ESD event having large current, the current path expands from the lightly doped region 420 to the $N^+$ region 410 of FIG. 3a. The snap-back voltage 610 is determined by the $N^+$ doping concentration. The snap-back voltage (Vsp) is:

$$Vsp = IRd + Vd + 0.7$$

where:

$$Vd = \epsilon E^2 max / (2q(Nd - n))$$

I is the current through drain 410 and 420 of FIG. 3a

Rd is the series resistance of the $N^+$ 410 and the $n^-$ 420 of FIG. 3a.

$\epsilon E^2$ max is the maximum voltage field between the drain $N^+$ 410 and the $n^-$ 420 to the substrate 460.

q is the charge of the electron.

Nd is the doping concentration of the drain $N^+$ 410.

n is the electron density.

As the current decreases, the current path shrinks to the lightly doped region 420 of FIG. 3a. The snap-back voltage is determined by the $n^-$ doping concentration of the lightly doped drain section 420. From the above equation the it can be seen that the snap voltage is proportional to $$1/(Nd - n),$$

such that the level 630>the level 610. The level 630 is sufficiently high as to cause damage to the gate oxide 480 of FIG. 3a and the internal integrated circuits of FIG. 1.

FIGS. 2c and 2d are cross sectional view of an abrupt junction NMOS transistor and a PMOS transistor. These two transistors are fabricated according to U.S. Pat. No. 5,246,872 (Mortensen) using the same processing as the LDD devices of FIGS. 2a and 2b.

The $N^+$ diffusions 210 and 240 respectively form the drain and source on the P-type substrate 260. The $P^+$ diffusion 250 provides a low resistivitiy path to connect the P-type substrate 260 to the ground reference terminal 255. The insulating film 280 forms the gate oxide with the metal film 290 forming the gate. The channel 270 is region beneath the gate oxide 280 between the drain 210 and the source 240.

In the N-well diffusion 365 on the P-type substrate 360, the PMOS transistor is formed by the $P^+$ diffusion 310 and 340, which are the source and the drain respectively, the gate oxide 380 and the gate 390. The N-well is connected to the Vcc 355 through the $N^+$ diffusion 350.

To form the connections for the NMOS transistor N1 of FIG. 1, the drain 210 is connected to the PAD 205 and the source 240 and gate 290 are connected to the ground reference terminal 255. To form the connections of the PMOS transistor P1 of FIG. 1, the drain 310 is connected to the PAD 305 and the source 340 and gate 390 are connected to the Vcc 355.

With an abrupt junction as shown in FIG. 2c, the voltage field in the gate oxide is not as great and the band to band tunneling will be sufficient to cause the parasitic transistor to conduct. FIG. 3d is a graph of the voltage 900 from the drain 210 of the NMOS transistor and the ground reference terminal 255 of FIG. 2c and of the current 950 through the parasitic transistor formed by the drain 210, the source 240, and the area beneath the source and drain 270 of FIG. 2c. When an ESD voltage is applied to the PAD 205 of FIG. 2c, the voltage 900 and the current 950 rise to the high level 905 until the parasitic transistor conducts. The voltage 900 is clamped to level 910, while the current 950 decays as the charge from the ESD generator is removed to the ground reference terminal 255 of FIG. 2c. The voltage level 910 is sufficiently low as to prevent damage to the gate oxide 280 of FIG. 2c and the internal integrated circuits of FIG. 1.

For the same drawn channel length, the duration of the peak 905 is somewhat because of the length of the channel 270 of FIG. 2c, since this is the base width of the parasitic transistor. This additional time is sufficient to cause stress in the gate oxide of internal integrated circuitry of FIG. 1.

U.S. Pat. No. 5,142,345 (Miyata) discloses a semiconductor device structure that can form a memory device, an LDD structure, and ESD input protection device on the same semiconductor substrate using the same manufacturing method.

SUMMARY OF THE INVENTION

An object of this invention is to provide a semiconductor device structure that will not be destroyed by the instantaneous application of a very large voltage such as an ESD event to an input Pad and will protect subsequent internal circuitry from destruction by the ESD event.

Another object of this invention is to provide a semiconductor device structure that can be manufactured with the standard LDD CMOS processing of the subsequent internal circuitry.

Still another object is to provide a semiconductor device structure that will conduct sufficiently quickly after the ESD event as to further prevent damage to the semiconductor device structure and to the subsequent internal circuitry.

To accomplish these and other objects, a semiconductor device structure is fabricated upon a semiconductor substrate of a material of a first conductivity type. A drain region of a high concentration of a material of a second conductivity type is diffused into the semiconductor substrate. A source region which has two areas is diffused into the semiconductor substrate some distance from the drain region. The first area of the source region is fabricated with the material of a second conductivity type having a low concentration, while the second region is fabricated with material of the second conductivity type of a high concentration. The first area of the source is place between the drain and the second area of the source. An insulating film is deposited in the region between the drain region and the source region on the surface of the semiconductor substrate to form a gate oxide. On the gate oxide a metal film is placed to form the gate.

The semiconductor device structure has a parasitic bipolar transistor. The collector of the parasitic bipolar transistor is the drain region, the base is the region between the source region and the drain region, and the emitter is the source region. The bulk resistance of the semiconductor substrate forms a parasitic resistor between the base and a substrate contact is connected to a ground reference potential.

The gate and the source is connected to the ground reference potential and the drain is connected to the PAD. When an ESD event occurs, the extremely large voltage is connected to the PAD. This causes a current to develop in the parasitic resistor which starts the parasitic transistor to conduct. The abrupt junction of the drain region allows the voltage across the parasitic transistor to be sufficiently low as to prevent damage to the semiconductor device structure and subsequent internal circuitry. The two areas of the source create a shorter base width of the parasitic transistor allowing it to conduct more rapidly.

BRIEF DESCRIPTION OF THE DRAWINGS

FIG. 3b is an energy band diagram of FIG. 3a.

FIG. 3c is a graph of the drain voltage and drain current of FIG. 3a.

FIG. 3d is a graph of the drain voltage and drain current of the semiconductor device structure of FIG. 2c.

DETAILED DESCRIPTION OF THE INVENTION

Figure 4:
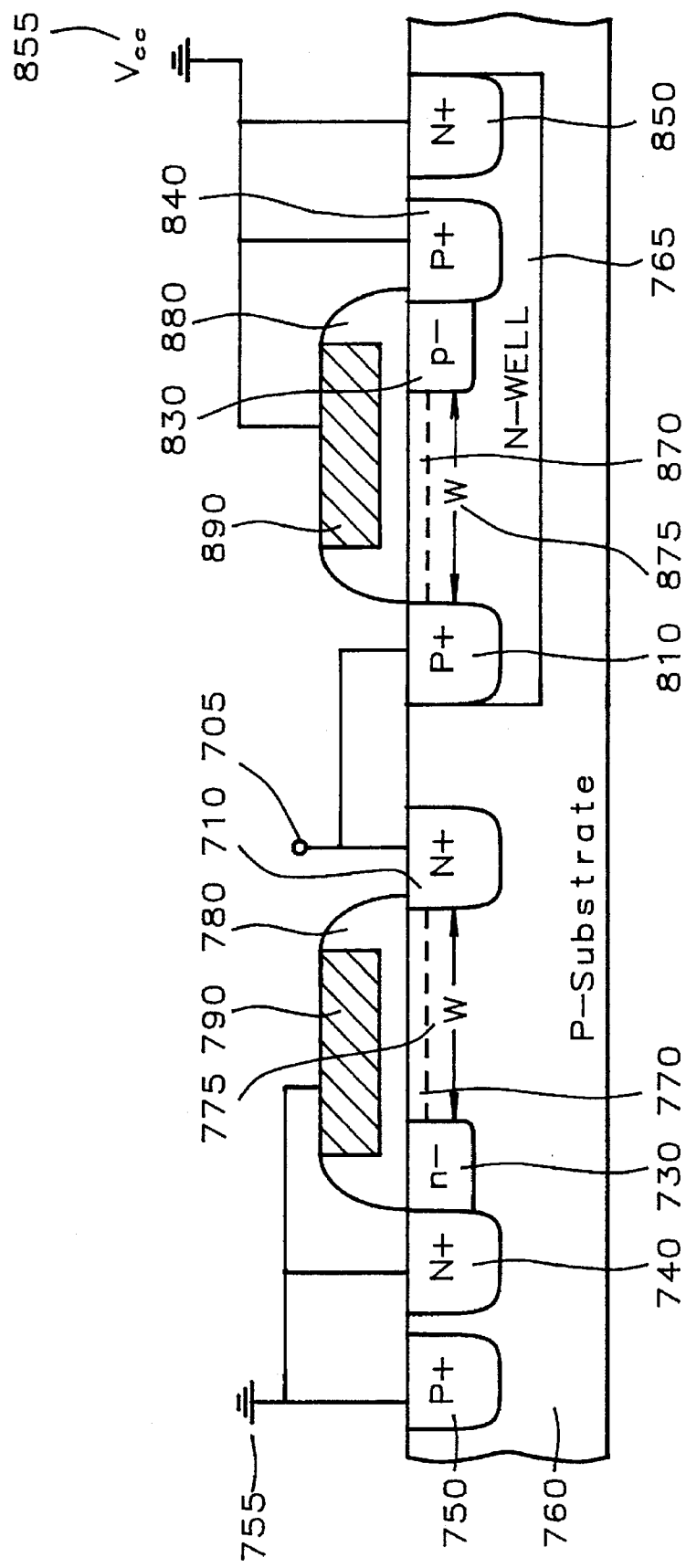
FIG. 4 is a cross sectional view of the NMOS version and PMOS version of the semiconductor device structure of the present invention.

Referring to FIG. 4, N$^+$ diffusions 710 and 740 are placed in the P-type substrate 760 to form the drain and the highly doped concentration section of the source, respectively. The N$^-$ diffusion 730 forms the LDD, low concentration doping section of the source. The P$^+$ diffusion 750 forms the a high conductivity path form the P-type substrate to the ground reference terminal 755. The insulating film 780 forms the gate oxide for the NMOS device structure, while the metal film 790 is the gate.

Figure 1:
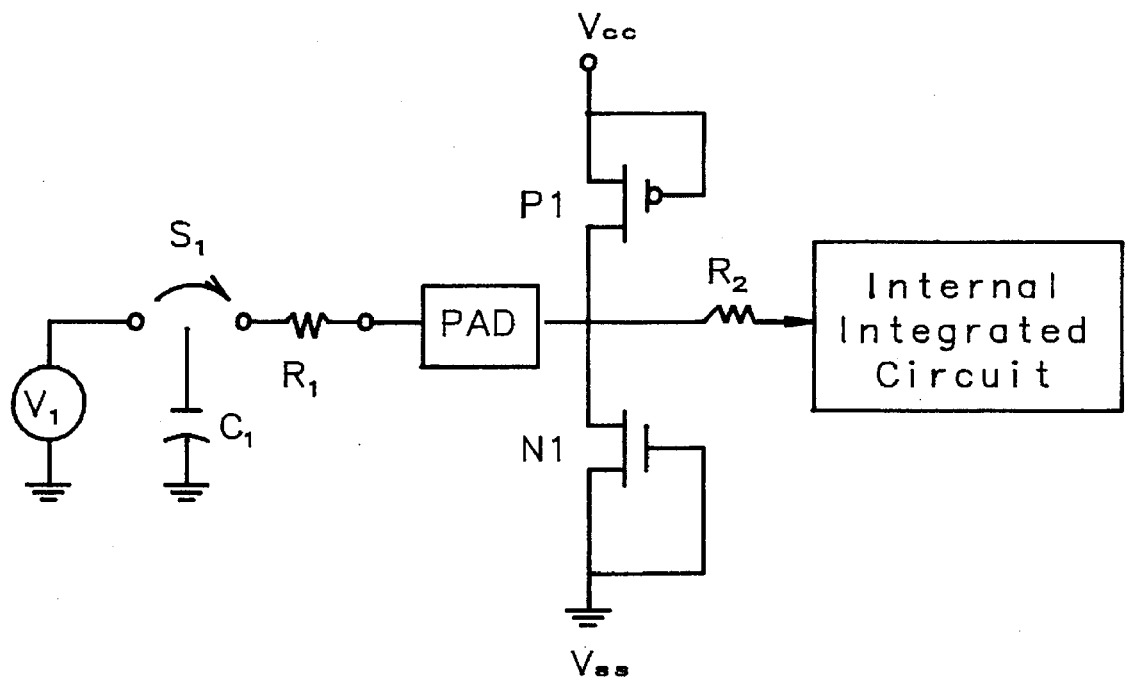
FIG. 1 is a schematic diagram of an input/output of an integrated circuit under an ESD event.
Figure 2A:
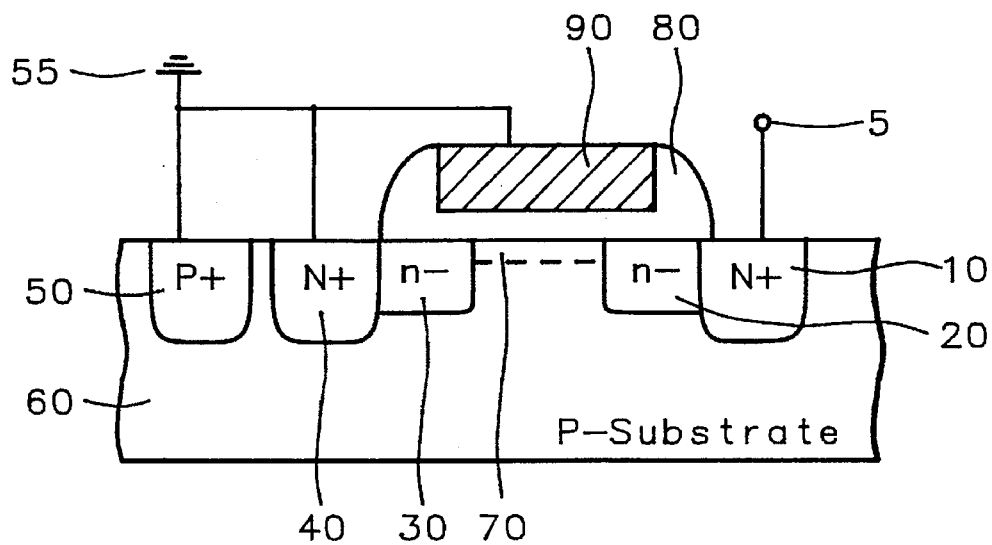
FIG. 2a and FIG. 2b are cross sectional views of LDD NMOS and PMOS transistors as configured for N1 and P1 of FIG. 1.
Figure 2B:
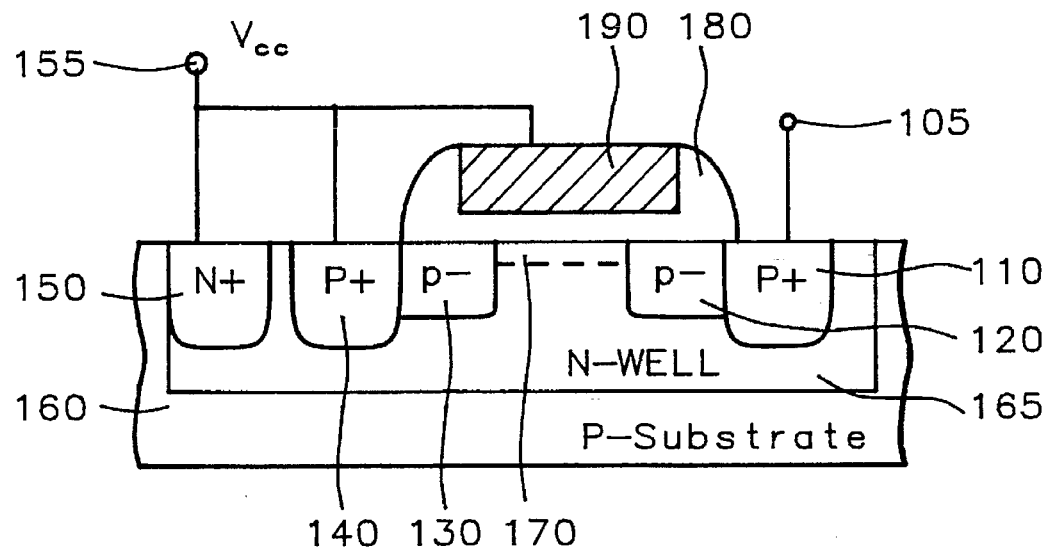
Figure 2C:
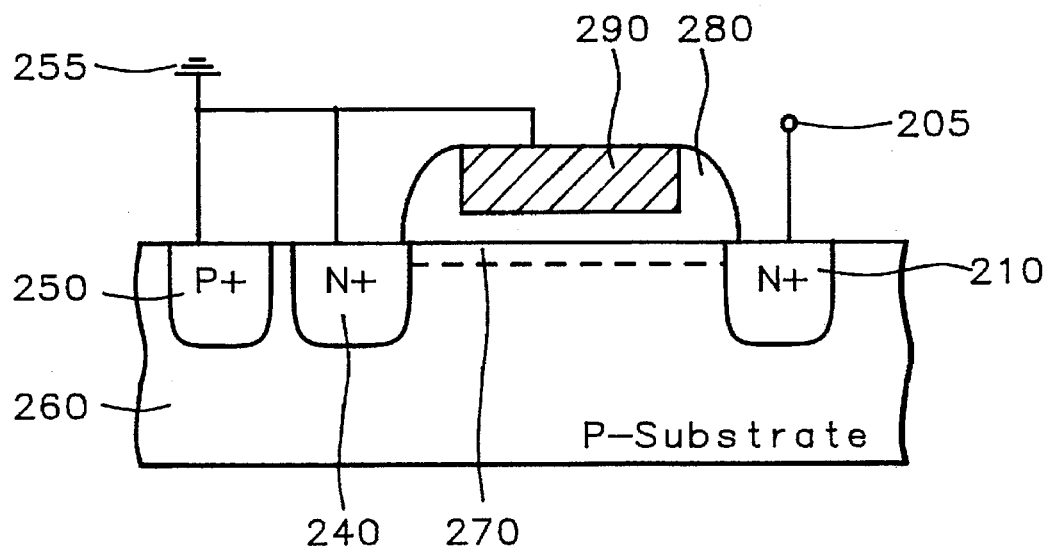
FIG. 2c and FIG. 2d are cross sectional views of abrupt junction NMOS and PMOS transistors of prior art as configured for N1 and P1 of FIG. 1
Figure 2D:
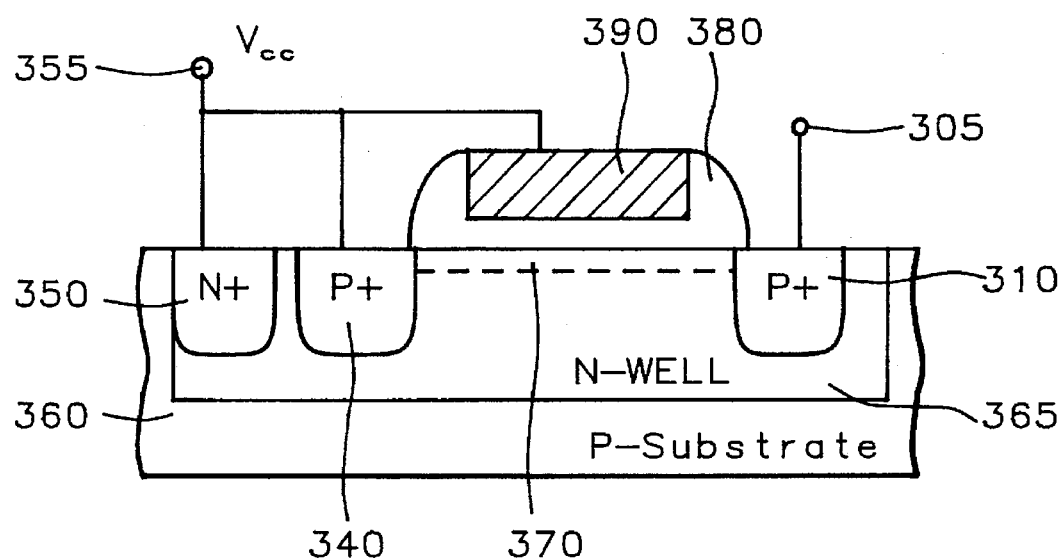

To make the connection for N1 of FIG. 1, the drain 710 is connected to the PAD 705 and the source 730 and 740 are connected to the ground reference terminal 755.

The N-well diffusion 765 is placed on the P-type substrate 760. P$^+$ diffusions 810 and 840 are placed in the N-well diffusion 765 to form the drain and the highly doped concentration section of the source respectively of the PMOS device structure. The P$^-$ diffusion 830 forms the LDD, low concentration section of the source. The N$^+$ diffusion 850 forms a high conductivity path from the N-well 765 to the Vcc 855. The insulating film 880 forms the gate oxide for the PMOS device structure and the metal film 890 forms the gate.

To make the connections as described for FIG. 1, the drain 810 is connected to the PAD 705. The source 830 and 840 and the gate 890 are connected to the Vcc 855.

Figure 3A:
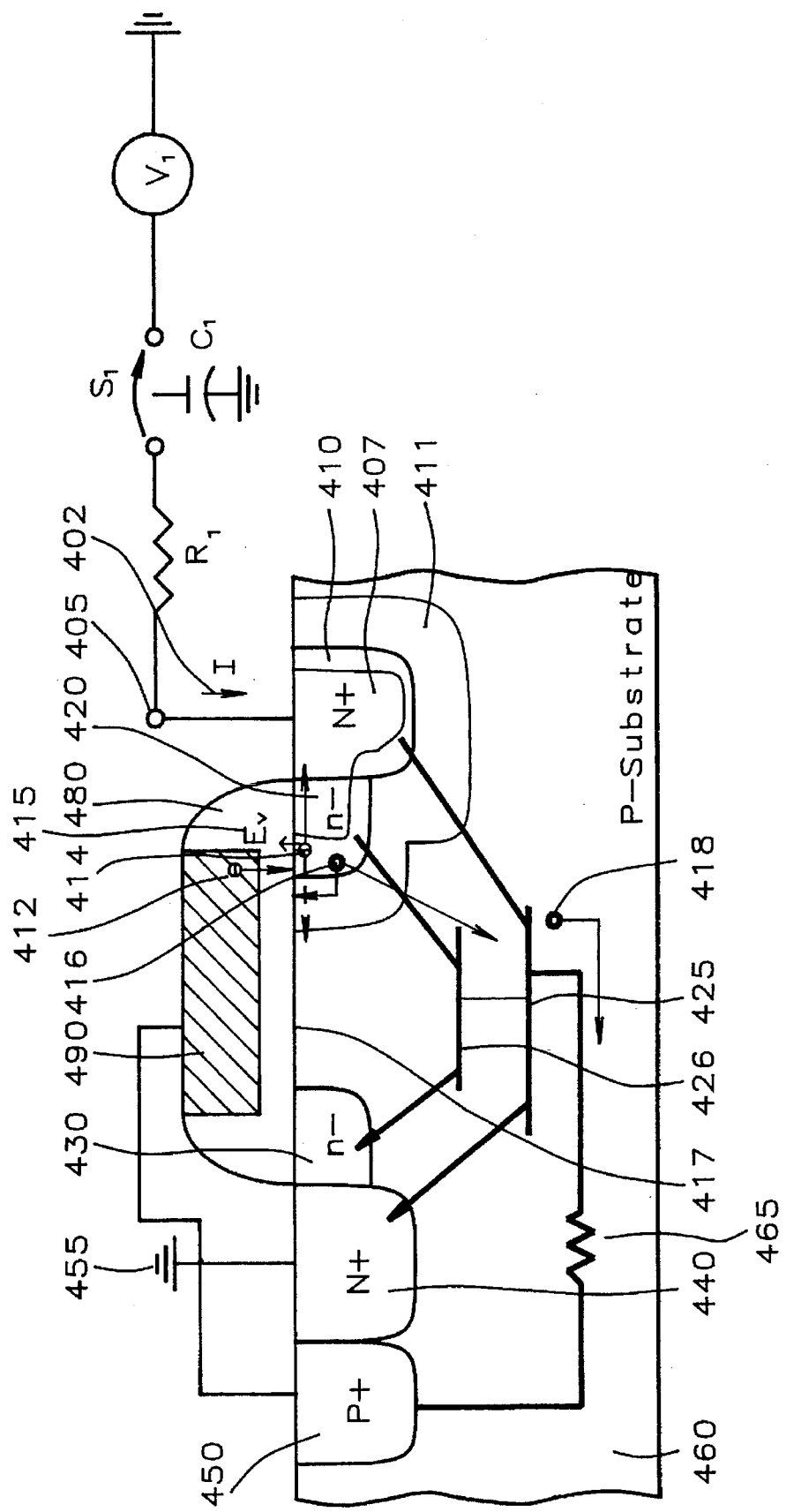
FIG. 3a is a cross sectional view of the NMOS transistor of FIG. 2a showing the parasitic transistor and parasitic resistor and the current flows and electric fields under an ESD event.
Figure 3B:
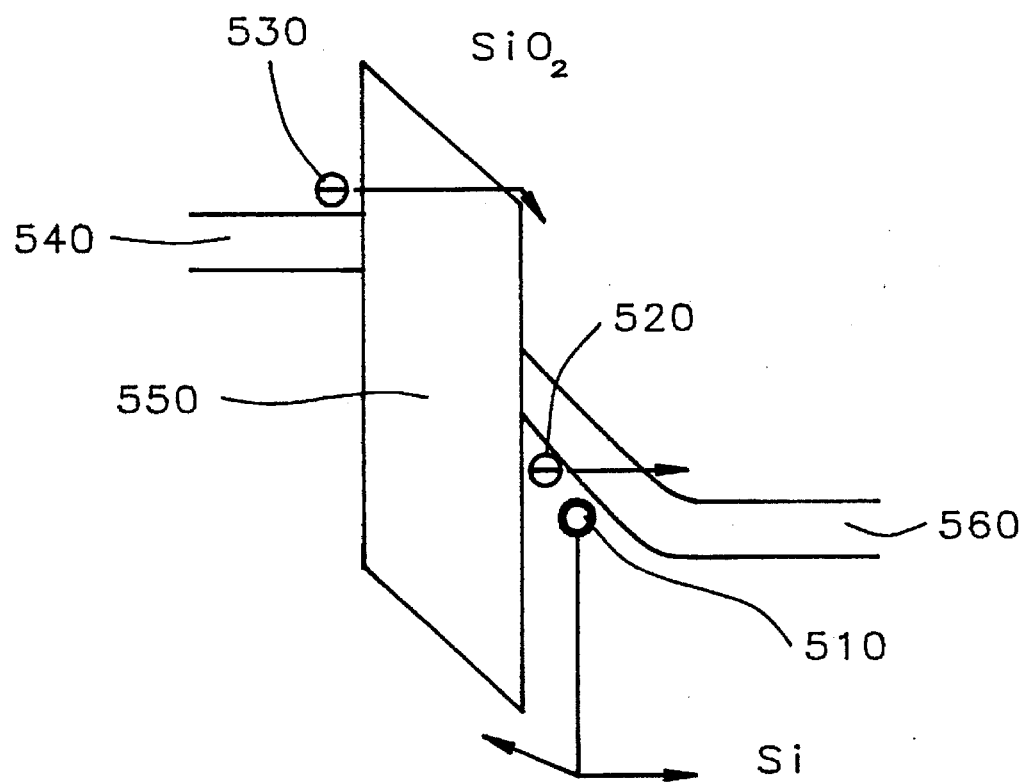

The NMOS and PMOS device structures operate as described in FIG. 3a. The parasitic transistor is formed by the NMOS device structure, wherein the collector is the drain 710, the emitters is the source 730 and 740, and the base is the channel region between the source 730 and 740 and the drain 710. The parasitic resistor is the bulk resistance of the N-well 765 from the base area 770 to the P$^+$ diffusion 750.

The PMOS device structure has a parasitic transistor, where the collector is the drain 810, the emitter is the source 830 and 840, and the base is the channel area 870 between the drain 810 and the source 830 and 840. The parasitic resistor is the bulk resistance of the N-well 765 from the base area 870 and the N$^+$ diffusion 850.

The abrupt junctions between the drains 710 and 810 and the P-type substrate 760 and the N-well 765 allow for a response similar to 910 of FIG. 3d. While the LDD's 730 and 830, allow for a shorter base width W 775 and 875, which will allow for a faster time for the device to start to conduction 905 of FIG. 3d.

Figure 5A:
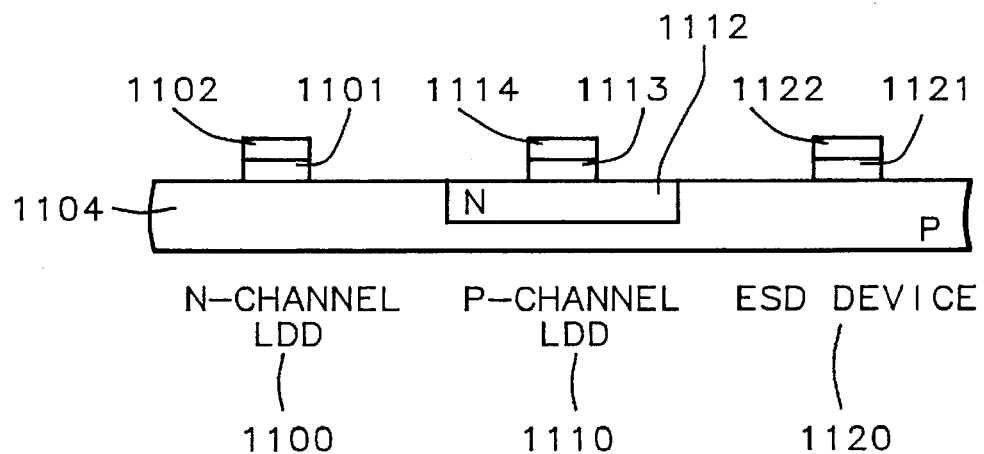
FIGS. 5a–5e are cross sectional views of semiconductor substrate as it is processed to form the NMOS LDD device, the PMOS LDD device, and the NMOS ESD device structure of this invention.

FIGS. 5a–5e illustrate the process for simultaneously fabricating the LDD NMOS device, the LDD PMOS device, and the ESD device structure of this invention. Referring to FIG. 5a, The P-type substrate 1104 has an N-well diffusion 1112 to form the P-channel device 1110. On the surface of the substrate 1104 is deposited and insulating film to for the gate oxides 1101, 1113, and 1121 for the N-channel device 1100, the P-channel device 1110, and the ESD device structure 1120, respectively. A metal film that forms the gates 1102, 1114, and 1122 of the N-channel device 1100, the P-channel device 1110, and the ESD device structure 1120, respectively, is placed on the gate oxides 1101, 1113, and 1121.

Figure 5B:
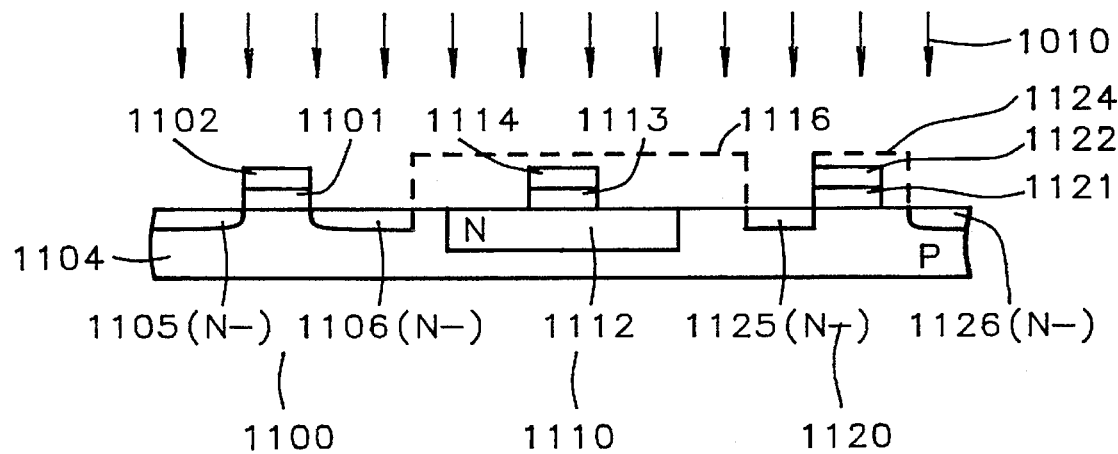

Next in FIG. 5b, a masking material 1116 is placed over the P-channel device 1110 and the portion 1124 of the ESD device structure 1120. An N-type material 1010 with a low concentration is diffused into the surface of the P-type substrate 1104 to form the N$^-$ regions 1105, 1106, 1125, and 1126, that will be the LDD areas. The gate 1102 and gate oxide 1101 of the N-channel device 1110 and the masking material 1116 and 1124 shield the regions of the P-type substrate 1104 from the diffusion 1010.

Figure 5C:
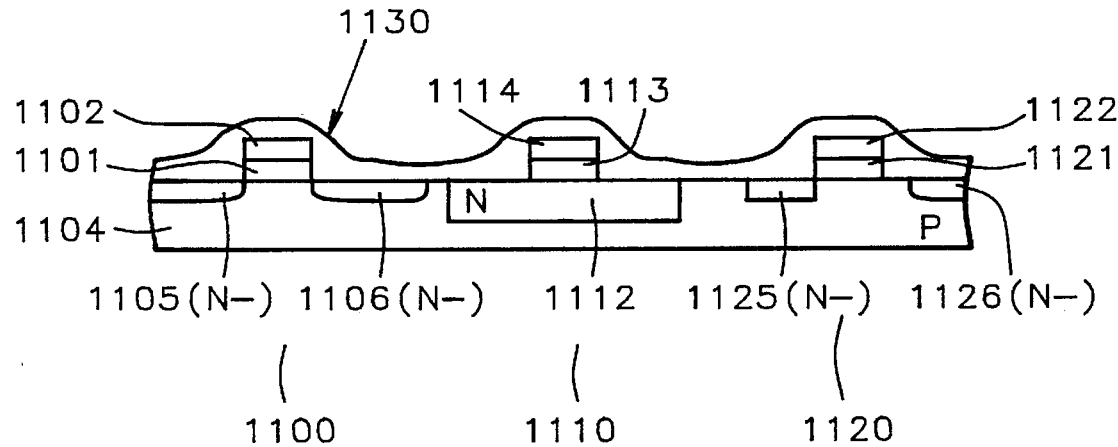
Figure 5D:
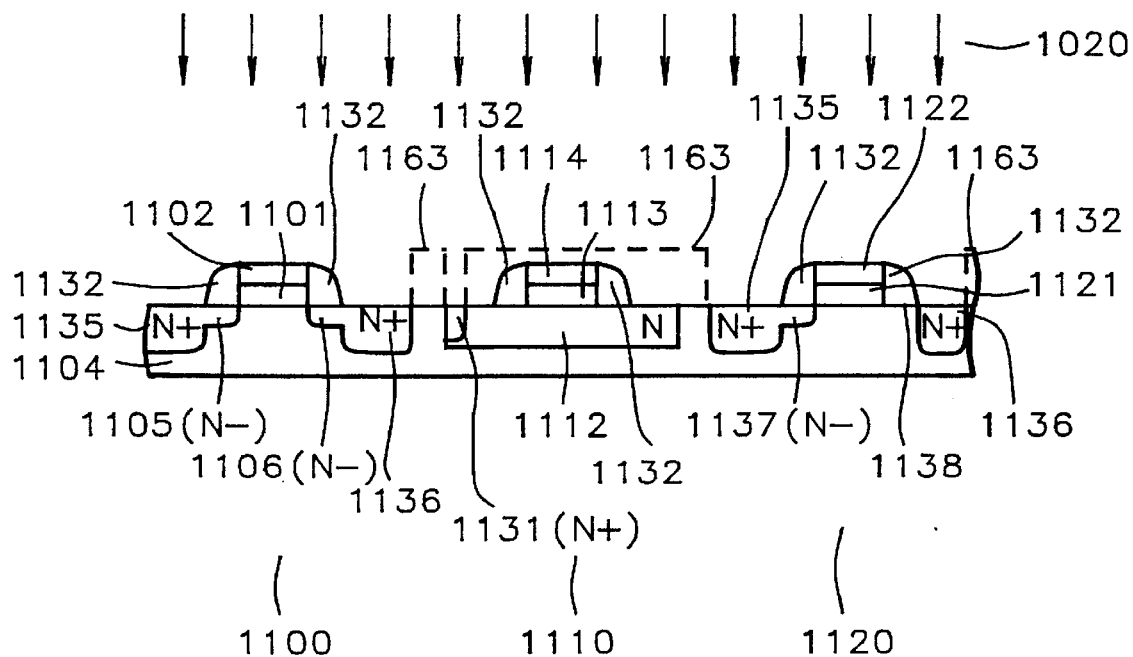

In FIG. 5c, an insulating film 1130 is deposited on the P-type substrate 1104 and removed in FIG. 5d to form the barrier oxides 1132. The masking material 1163 is deposited on the surface of the P-type substrate 1104 to shield the P-channel device 1110. An N-type material 1020 of high concentration is diffused in the areas of the P-type substrate 1104 to form the source 1135 and the drain 1136 of the N-channel device 1110 and the ESD device structure 1120 and the N$^+$ contact 1131 to the N-well 1112. The area 1138 in the ESD device structure 1120 allows the formation of the abrupt junction at the drain 1136.

Figure 5E:
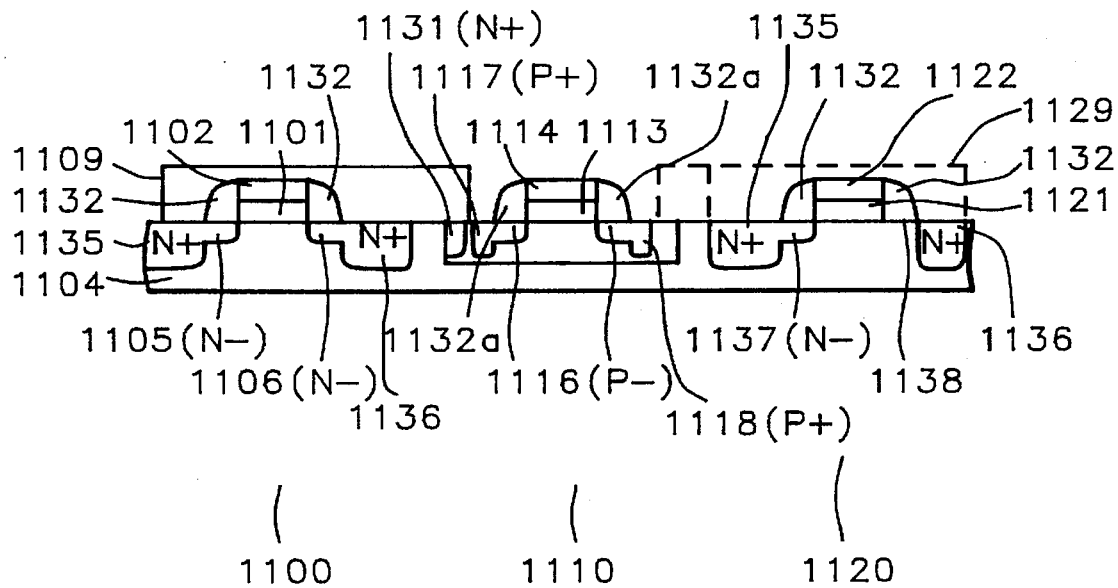

The masking material 1163 is removed in FIG. 5e and replaced with masking material 1109 and 1129. The P-channel device 1110 has P$^-$ diffusion 1116 is implanted to form the LDD areas, while the P$^+$ diffusions 1117 and 1118 are implanted to form the source and drain. The barrier oxide 1132 of FIG. 5d is removed on the P-channel device 1110 and replaced during the processing of FIG. 5e with barrier oxide 1132a.

While the invention has been particularly shown and described with reference to the preferred embodiments thereof, it will be understood by those skilled in the art that various changes in form and details may be made without departing from the spirit and scope of the invention.

What is claimed is:

1. A process for the fabrication of an integrated circuit device simultaneously with an electrostatic discharge protection device structure upon a semiconductor substrate of a material of a first conductivity type, having a property of bulk resistance, comprises the steps of:

a) forming a gate oxide region by the deposition of an insulating film upon the semiconductor substrate;

b) forming of a gate metalization upon the gate oxide region;

c) placing of first resist area over the semiconductor substrate to prevent areas on the semiconductor substrate from being effected by subsequent steps of said process;

d) diffusion of a material of a second conductivity with a low doping concentration on to areas of the semiconductor substrate to form areas of lightly doped drains on each side of the gate oxide region;

e) removal of the first resist area and placing of a second resist area in contact with the gate oxide region to protect the semiconductor substrate beneath said second resist area from subsequent processing;

f) diffusion of a material of a second conductivity with a high doping concentration on to areas of the semiconductor substrate to sources and the drains of the integrated circuit device and the electrostatic discharge protection device structure;

g) removal of the second resist area;

h) contacting of selected areas of the integrated circuit device and the drain of the electrostatic discharge protection device structure to an input pad; and i) contacting of other selected areas of the integrated circuit device and the source and gate of the electrostatic discharge protection device structure to a reference voltage source, such that upon an application of an extremely high voltage from an electrostatic discharge event will cause the electrostatic discharge protection device structure to conduct and prevent the extremely high voltage from contacting said integrated circuit device.

2. The process of claim 1 wherein said process forms:

a) a parasitic bipolar transistor, which comprises a collector that is the drain of the electrostatic discharge protection device structure, a base that is a segment of the semiconductor substrate between the drain region and the source region drain of the electrostatic discharge protection device structure, and an emitter that the source region drain of the electrostatic discharge protection device structure, and b) a parasitic resistor that is comprised of the bulk resistance of the semiconductor substrate;

wherein, when the extremely high voltage of an electrostatic discharge event is placed at the collector, the abrupt junction will have a tunneling current that will flow through the parasitic resistor and develop a voltage that is of sufficient magnitude to start said parasitic transistor to conduct.

3. The process of claim 1 wherein the diffusion of the material of the second conductivity with a low doping concentration is at only the source of the electrostatic discharge protection device structure to form a short length of the base to decrease a time required for said electrostatic discharge protection device structure to conduct.

4. The process of claim 1 wherein the diffusion of the material of the second conductivity of high concentration is such that the drain has an abrupt junction that will have a very low voltage across said abrupt junction when said Electrostatic discharge event has placed said electrostatic discharge protection device structure in conduction.

* * * * *